(12) United States Patent
Lal et al.

(10) Patent No.: US 9,978,990 B2
(45) Date of Patent: May 22, 2018

(54) WAVEGUIDES COMPRISING LIGHT EXTRACTION NANOSTRUCTURES AND DISPLAY DEVICES COMPRISING THE SAME

(71) Applicant: Corning Incorporated, Corning, NY (US)

(72) Inventors: Archit Lal, Ithaca, NY (US); Pamela Arlene Maurey, Savona, NY (US); Daniel Aloysius Nolan, Corning, NY (US); Wageesha Senaratne, Horseheads, NY (US)

(73) Assignee: Corning Incorporated, Corning, NY (US)

( * ) Notice: Subject to any disclaimer, the term of this patent is extended or adjusted under 35 U.S.C. 154(b) by 0 days. days.

(21) Appl. No.: 15/274,301

(22) Filed: Sep. 23, 2016

(65) Prior Publication Data

US 2018/0019442 A1    Jan. 18, 2018

Related U.S. Application Data

(60) Provisional application No. 62/361,192, filed on Jul. 12, 2016.

(51) Int. Cl.
*H01L 35/24* (2006.01)
*H01L 51/52* (2006.01)
*F21V 8/00* (2006.01)
*H01L 27/32* (2006.01)

(52) U.S. Cl.
CPC ........ *H01L 51/5262* (2013.01); *G02B 6/0041* (2013.01); *G02B 6/0043* (2013.01); *G02B 6/0065* (2013.01); *H01L 27/32* (2013.01)

(58) Field of Classification Search
None
See application file for complete search history.

(56) References Cited

U.S. PATENT DOCUMENTS

| | | | |
|---|---|---|---|
| 7,432,649 | B2 | 10/2008 | West |
| 7,834,539 | B2 | 11/2010 | Handa et al. |
| 8,427,747 | B2 | 4/2013 | Le et al. |
| 8,538,224 | B2 | 9/2013 | Lamansky et al. |
| 8,659,221 | B2 | 2/2014 | Jones et al. |
| 8,692,446 | B2 | 4/2014 | Zhang et al. |
| 8,907,365 | B2 | 12/2014 | Baker et al. |

(Continued)

FOREIGN PATENT DOCUMENTS

| | | |
|---|---|---|
| CN | 103531720 A | 1/2014 |
| CN | 103700783 A | 4/2014 |

(Continued)

OTHER PUBLICATIONS

Glass Substrates for OLED Lighting with High Out-coupling Efficiency Asahi Glass research, SID 2009.

(Continued)

*Primary Examiner* — Jack Chen

(57) ABSTRACT

Disclosed herein are OLED devices comprising waveguides including at least one waveguide layer comprising at least one inorganic nanoparticle and at least one binder and having an RMS surface roughness of less than about 20 nm. Lighting and display devices comprising such OLED devices are further disclosed herein as well as methods for making the waveguides.

5 Claims, 6 Drawing Sheets

(56) References Cited

U.S. PATENT DOCUMENTS

| | | |
|---|---|---|
| 8,946,754 B2 | 2/2015 | Gollier et al. |
| 2004/0217702 A1 | 11/2004 | Garner et al. |
| 2013/0286659 A1 | 10/2013 | Lee et al. |
| 2014/0291656 A1 | 10/2014 | Gollier et al. |
| 2016/0072101 A1 | 3/2016 | Choi et al. |
| 2016/0116696 A1* | 4/2016 | Modavis ............ G02B 6/12004 385/14 |
| 2016/0291236 A1 | 10/2016 | Baker et al. |
| 2017/0084874 A1 | 3/2017 | Baker et al. |

FOREIGN PATENT DOCUMENTS

| | | |
|---|---|---|
| WO | 2016065101 A1 | 4/2016 |
| WO | 2016130731 A1 | 8/2016 |

OTHER PUBLICATIONS

Advanced Glass Substrate for the Enhancement of OLED Lighting Out-coupling Efficiency, Asahi, SID, 2013.
Novel Light-Scattering Glass Substrate for the Enhancement of OLED Lighting Out-coupling Efficiency, Asahi, SID, 2012.
Cheng et al. "Demonstration of organic light emitting diodes fabricated on flexible Al2O3-embedded poly(dimenthylsiloxane) substrates" Journal of Applied Physics 48(2), 2009. pp. 21502-1.
International Search Report and Written Opinion PCT/US2016/053495 dated Mar. 24, 2017.
Komoda, "Recent Progress of OLED Technologies for Lighting Application", Panasonic, OLED world summit conference 2014, 30 slides.
Tsujimura, "Flexible OLED Lighting Advancements," Konica Minolta Inc., OLED world summit conference 2014, 36 slides.

* cited by examiner

WAVEGUIDES COMPRISING LIGHT EXTRACTION NANOSTRUCTURES AND DISPLAY DEVICES COMPRISING THE SAME

This application claims the benefit of priority under 35 U.S.C. § 119 of U.S. Provisional Application Ser. No. 62/361,192 filed on Jul. 12, 2016, the content of which is relied upon and incorporated herein by reference in its entirety.

FIELD OF THE DISCLOSURE

The disclosure relates generally to waveguides and display devices comprising such waveguides, and more particularly to waveguides comprising at least one light extracting nanostructure and OLED devices comprising the same.

BACKGROUND

High-performance display devices, such as liquid crystal (LC), organic light emitting diode (OLED), and plasma displays, are commonly used in various electronics, such as cell phones, laptops, electronic tablets, televisions, and computer monitors. OLED light sources have increased in popularity for use in display and lighting devices due to their improved color gamut, high contrast ratio, wide viewing angle, fast response time, low operating voltage, and/or improved energy efficiency. Demand for OLED light sources for use in curved displays has also increased due to their relative flexibility.

A basic OLED structure can comprise an organic light emitting material disposed between an anode and a cathode. The multi-layer structure can include, for example, an anode, a hole injection layer, a hole transporting layer, an emitting layer, an electron transporting layer, an electron injection layer, and a cathode. During operation, the injected electrons from the cathode and holes from the anode can be recombined in the emitting layer to generate excitons. When current is supplied to the organic light emitting material, light is given off due to the radioactive decay of the excitons. To form a display device comprising an OLED, a plurality of anodes and cathodes can be driven by a thin film transistor (TFT) circuit. The TFT array thus provides an array of pixels which can then be used to display selected images by the application of current through the anodes and cathodes.

While OLED display devices may have numerous advantages over other display devices, such as LCDs, OLEDs may still suffer from one or more drawbacks. For example, OLEDs can have limited light output efficiency (luminance) as compared to other light sources. In some instances, as much as 80% of the light energy emitted by the OLED may be trapped in the display device. Light generated by the emitting layer can, for instance, be confined within the electrode and glass substrate of the device due to a large difference in refractive index (n) values for these layers (e.g., $n_e \approx 1.9$, $n_g \approx 1.5$). Snell's law suggests that the difference in refractive indices produces a low out-coupling efficiency in the range of about 20%, where the efficiency level is expressed as the ratio of surface emission to the total emitted light. Thus, even though internal efficiencies nearing 100% have been reported, the low out-coupling efficiency ultimately limits the brightness and efficiency of the OLED device.

Numerous methods for improving light extraction efficiency of OLED devices have been proposed, including high index substrates and particles and/or various surface modifications. However, these techniques may require expensive materials and/or complex processes, such as photolithography and the like, which can unnecessarily increase the manufacturing time and overall cost of the device. Attempts to increase the light output of an OLED device have also included driving the OLED at relatively high current levels. However, such high currents can have a negative impact on the lifespan of the OLED and thus also fail to provide an ideal solution.

Other attempts to improve light extraction efficiency include, for example, waveguides that are matched to the OLED layer in thickness and/or index, such that modes within the OLED can be matched with modes within the waveguide. Such waveguides can be deposited on a glass substrate and subsequently coated with a planarizer (e.g., smoothing) layer. Improved light extraction has been observed with relatively thin planarizer layers (e.g., less than about 0.5 microns). Thicker planarizer layers may, for example, yield an insufficiently small overlap between the evanescent OLED light and the waveguide modes. However, thinner planarizer layers may result in an overly rough interface between the waveguide and OLED layer, which can cause coupling within the modes of the OLED, such that light can couple from one of these propagating modes to a surface plasmon mode (or surface plasmon polariton). Surface plasmon modes are highly absorbing and, thus, coupling of light to these modes is typically undesirable. Moreover, waveguides including planarizer layers require multi-step processing, which can increase manufacturing time and/or cost.

Accordingly, it would be advantageous to provide waveguides for display (e.g., OLED) devices that can provide improved light extraction efficiency while also reducing the cost, complexity, and/or time for manufacturing the device. Additionally, it would be advantageous to provide waveguides having a desirable surface roughness without the use of a planarizer layer. Furthermore, it would be advantageous to provide methods for making waveguides using a single-step coating process.

SUMMARY

The disclosure relates, in various embodiments, to organic light emitting diode devices comprising a cathode, an anode, an organic light emitting layer disposed between the cathode and anode; and a substrate comprising at least one waveguide layer, the waveguide layer comprising at least one inorganic nanoparticle having a refractive index $n_m$ ranging from about 1.6 to about 2.6, at least one binder having a refractive index $n_b$ ranging from about 1.3 to about 1.55, and an RMS surface roughness of less than about 20 nm.

Also disclosed herein are organic light emitting diode devices comprising a cathode, an anode, an organic light emitting layer disposed between the cathode and anode; and a substrate comprising at least one waveguide layer, the waveguide layer comprising at least one inorganic nanoparticle having a refractive index $n_m$ ranging from about 1.6 to about 2.6, at least one binder having a refractive index $n_b$ ranging from about 1.3 to about 1.55, a high density region having an effective refractive index $n_{w1}$ greater than or equal to about 1.7, and a low density region having an effective refractive index $n_{w2}$ ranging from about 1.4 to less than about 1.7.

Further disclosed herein are coating compositions for a waveguide, the compositions comprising at least one metal oxide nanoparticle having a refractive index $n_m$ ranging from about 1.6 to about 2.6, at least one binder chosen from silicate and organosilicon materials having a refractive index $n_b$ ranging from about 1.3 to about 1.55, and at least one solvent, wherein the coating composition, upon application to a substrate surface, has an RMS surface roughness of less than about 20 nm.

Still further disclosed herein are methods for making a waveguide, the methods comprising combining a first dispersion and a second dispersion to form a combined dispersion, wherein the first dispersion comprises at least one first solvent and at least one inorganic nanoparticle having a refractive index $n_m$ ranging from about 1.6 to about 2.6, the second dispersion comprises at least one second solvent and at least one binder having a refractive index $n_b$ ranging from about 1.3 to about 1.55; and coating the combined dispersion on at least one surface of a substrate to form a waveguide layer having an RMS surface roughness of less than about 20 nm.

According to various embodiments, the at least one inorganic nanoparticle may be chosen from zirconium, zinc, titanium, cerium, hafnium, niobium, tantalum, or aluminum oxides, mixed metal oxides thereof, and combinations thereof. The at least one inorganic nanoparticle can, for example, comprise a combination of a first metal oxide nanoparticle and a second metal oxide nanoparticle and, in some embodiments, the first and second metal oxide nanoparticles can have different particle size distributions. In additional embodiments, the at least one binder may be chosen from silicate and organosilicon materials. The at least one waveguide layer can have a haze of less than about 50% and an optical transmission of greater than about 75% at visible wavelengths. According to further embodiments, the at least one waveguide layer may have a thickness ranging from about 100 nm to about 2 microns. In yet further embodiments, the at least one waveguide layer may have a surrogate light extraction efficiency value of at least about 2. According to still further embodiments, the substrate may comprise a single waveguide layer and/or may not comprise a planarizer film.

Additional features and advantages of the disclosure will be set forth in the detailed description which follows, and in part will be readily apparent to those skilled in the art from that description or recognized by practicing the methods as described herein, including the detailed description which follows, the claims, as well as the appended drawings.

It is to be understood that both the foregoing general description and the following detailed description present various embodiments of the disclosure, and are intended to provide an overview or framework for understanding the nature and character of the claims. The accompanying drawings are included to provide a further understanding of the disclosure, and are incorporated into and constitute a part of this specification. The drawings illustrate various embodiments of the disclosure and together with the description serve to explain the principles and operations of the disclosure.

BRIEF DESCRIPTION OF THE DRAWINGS

The following detailed description can be further understood when read in conjunction with the following drawings.

DETAILED DESCRIPTION

Devices

Disclosed herein are organic light emitting diode devices comprising a cathode, an anode, an organic light emitting layer disposed between the cathode and anode; and a substrate comprising at least one waveguide layer, the waveguide layer comprising at least one inorganic nanoparticle having a refractive index $n_m$ ranging from about 1.6 to about 2.6, at least one binder having a refractive index $n_b$ ranging from about 1.3 to about 1.55, and an RMS roughness of less than about 20 nm. Also disclosed herein are organic light emitting diode devices comprising a cathode, an anode, an organic light emitting layer disposed between the cathode and anode; and a substrate comprising at least one waveguide layer, the waveguide layer comprising at least one inorganic nanoparticle having a refractive index $n_m$ ranging from about 1.6 to about 2.6, at least one binder having a refractive index $n_b$ ranging from about 1.3 to about 1.55, a high density region having an effective refractive index $n_{w1}$ greater than or equal to about 1.7, and a low density region having an effective refractive index $n_{w2}$ ranging from about 1.4 to less than about 1.7.

Figure 1:
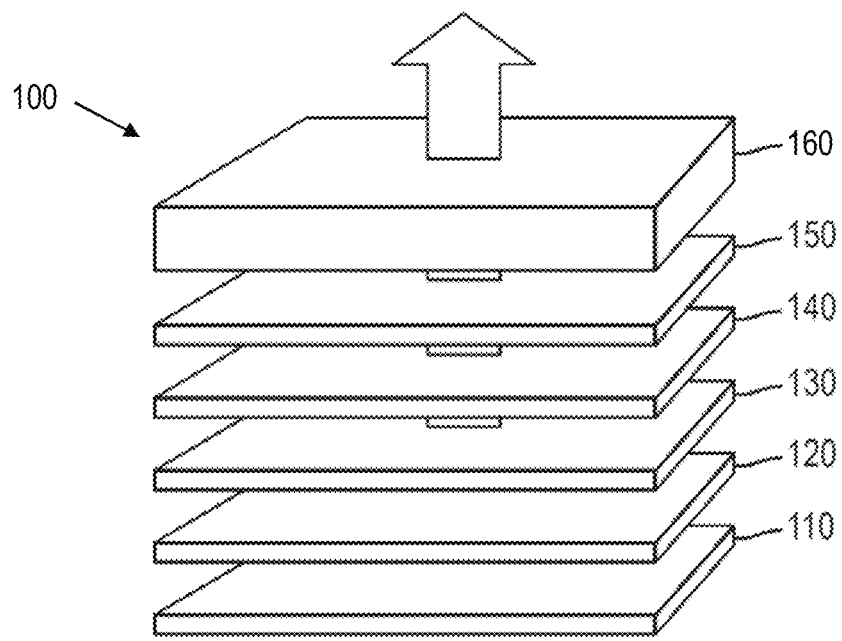
FIG. 1 illustrates an organic light emitting diode (OLED) device according to various embodiments of the disclosure.

FIG. 1 is a general depiction of an exemplary OLED device 100. The device 100 can comprise a cathode 110, an electron transporting layer 120, an organic light emitting layer 130, a hole transporting layer 140, an anode 150, and a waveguide 160. In the depicted embodiment, the device may emit light through the waveguide 160, in which case the anode 150 may comprise a substantially transparent or semi-transparent material, such as indium tin oxide (ITO) or any other conductive material with a suitable transparency. The cathode can be chosen from conductive materials, such as Ag, Au, Al, Sm, Tm, Yb, mixtures thereof, or bimetallic materials, e.g., Ca:Al, Eu:Yb, or Tm:Yb. In other non-illustrated embodiments, the device 100 can emit light through a transparent or semi-transparent cathode 110, e.g., an organic layer, in which case the waveguide 160 may be positioned adjacent the cathode 110. Additional layers in the light emitting device 100 can include a hole injection layer (HIL) and/or an electron injection layer (EIL) (not illustrated). Waveguides disclosed herein can, in some embodiments, comprise a substrate and at least one light scattering layer coated on the substrate. For instance, the light scattering layer may be positioned between the substrate and the anode or cathode, as further described in connection with FIGS. 4 and 6.

Figure 2:
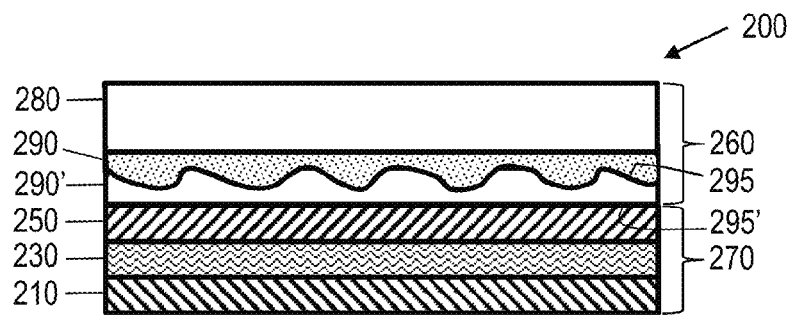
FIG. 2 depicts an OLED device comprising a light scattering layer and a planarizer layer.

FIG. 2 illustrates an OLED device 200 comprising a diode structure 270 and a light extracting structure 260. The diode structure 270 may comprise a cathode 210, organic light emitting layer 230, and an anode 250, as well as other non-illustrated components. The light extracting structure 260 may be positioned adjacent the anode 250 (as illustrated) or the cathode 210. For instance, the light extracting structure 260 may be in direct physical contact with the anode or cathode, or any other component of the diode structure 270. The light extracting structure 260 can comprise a substrate 280 coated with at least one light scattering layer 290. As illustrated, the light scattering layer may have a rough, uneven surface 295 not suitable for electrical contact with the other components of the OLED (e.g., RMS roughness>20 nm or even >50 nm). As such, the light scattering layer is often coated with a separate planarizer layer 290' to reduce the roughness of the light scattering layer and create a smoother interface 295'.

Figure 3:
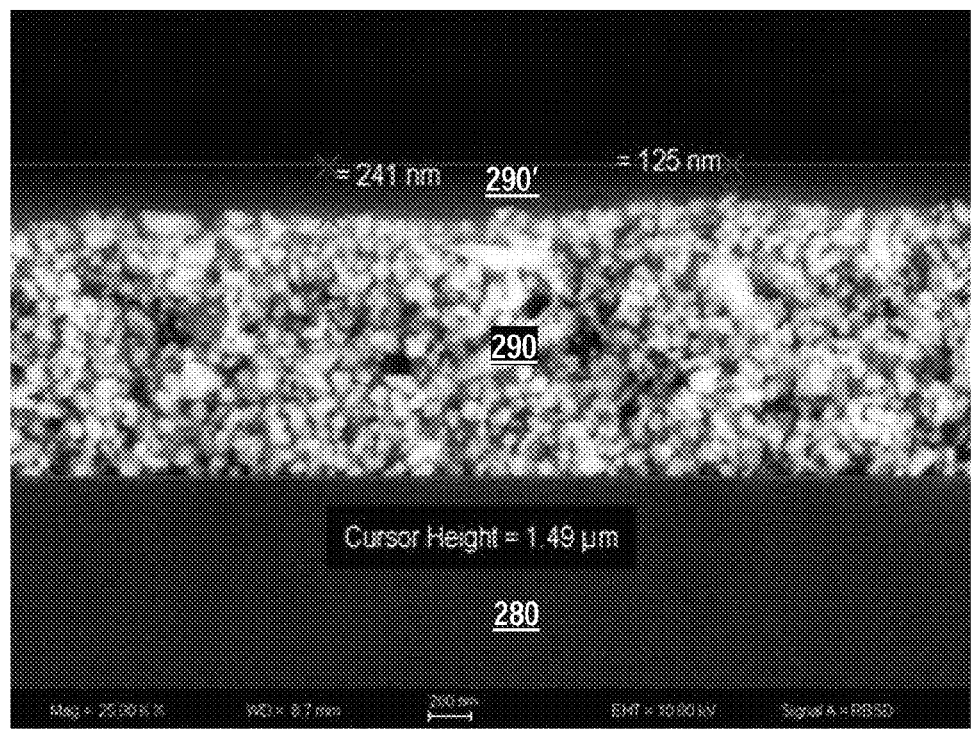
FIG. 3 is a scanning electron microscopy (SEM) image of an OLED device configured as depicted in FIG. 2.

FIG. 3 is a scanning electron microscopy (SEM) image of the configuration depicted in FIG. 2. The substrate 280 is coated with a light scattering layer 290, which is coated with a planarizer layer 290'. A well-defined interface can be visually observed between layers 290 and 290', indicating that these are separate and distinct layers. While including such a planarizer layer may reduce the roughness of the light scattering layer, thereby improving the stability of the device, the extra steps involved with providing a separate planarizer layer may be costly and/or time-consuming. As such, it would be advantageous to provide substrates comprising a single light scattering layer, e.g., without the need for a separate planarizer layer.

Figure 4:
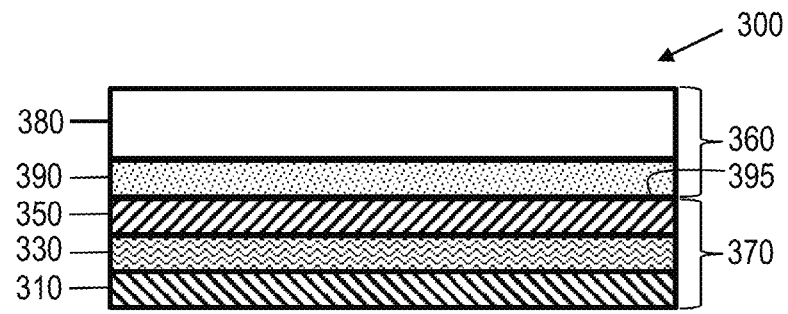
FIG. 4 depicts an exemplary OLED device comprising a single waveguide layer according to certain embodiments of the disclosure.
Figure 6:
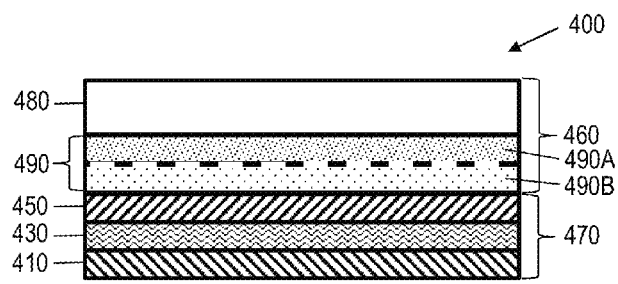
FIG. 6 depicts an exemplary OLED device comprising a waveguide layer having a high density region and a low density region according to various embodiments of the disclosure.

FIGS. 4 and 6 illustrate exemplary OLED device 300 according to various embodiments of the disclosure. Referring to FIG. 4, the device 300 can comprise a diode structure 370 (anode 310, light emitting layer 330, cathode 350) and a light extracting structure 360 (substrate 380, waveguide layer 390). The waveguide layer 390 may, in non-limiting embodiments, have a root mean square (RMS) surface roughness of less than about 20 nm. In certain embodiments, the waveguide layer 390 may have a light scattering surface, e.g., in contact with the anode or cathode, that is substantially smooth (RMS less than about 20 nm), such that an additional planarizer layer is not required between the waveguide layer and the anode or cathode. However, in other embodiments, a planarizer layer may optionally be present in the light extracting structure 360.

With reference to FIG. 6, the device 400 can comprise a diode structure 470 (anode 410, light emitting layer 430, cathode 450) and a light extracting structure 460 (substrate 480, waveguide layer 490). The waveguide layer 490 may, in non-limiting embodiments, comprise a high density region 490A and a low density region 490B. As used herein, regions of "high density" and "low density" are intended to refer to the concentration of inorganic nanoparticles in the respective regions. Regions with higher nanoparticle concentrations may have higher densities as compared to regions of lower nanoparticle concentrations. Moreover, while FIG. 6 illustrates the high density region 490A positioned between the substrate 480 and the low density region 490B, as viewed in a direction perpendicular to the plane of the substrate, the reverse configuration is also possible, in which the low density region 490B is positioned between the substrate 480 and the high density region 490A. For instance, the high density region 490A may be in contact with the substrate 480 or, in the reverse configuration, the low density region 490B may be in contact with the substrate. Furthermore, a concentration gradient of inorganic nanoparticles (and, thus, a density gradient) may also be present in the waveguide layer 490, e.g., such that concentration and/or density decreases with distance from the substrate surface, or vice versa. In various embodiments, the waveguide layer can comprise more than two density regions, e.g., a third region of intermediate density, and so forth.

Figures 7A, 7B:
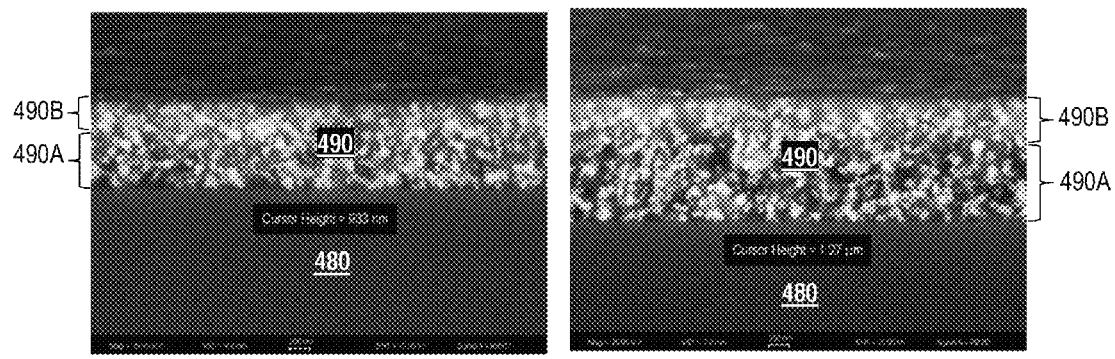
FIGS. 7A-B are SEM images of OLED devices configured as depicted in FIG. 6.

While the regions 490A, 490B in FIG. 6 are demarcated by a dashed line for purposes of illustration, it is to be understood that these regions are part of the same waveguide layer 490 and are not separate layers, but regions of varying density within the same layer. For example, referring to FIGS. 7A-B, which are SEM images of two waveguide layers 490 having different thicknesses, it can be appreciated that there is no clear demarcation between the high density regions 490A and the low density regions 490B, and the inorganic nanoparticles are homogenously distributed in each region, albeit in different relative concentrations.

With reference to FIGS. 4 and 6, the waveguide layer 390, 490 can comprise at least one inorganic nanoparticle, e.g., a plurality of metal oxide nanoparticles. Non-limiting examples of suitable inorganic nanoparticles can include, for instance, zirconia, zirconia, alumina, anatase or rutile titania, cerium oxide, niobium oxide, zinc oxide, tin oxide, tantalum oxide, hafnium oxide, mixed metal oxides, and combinations thereof. The nanoparticles may further comprise at least one stabilizing agent, such as Y, Yb, Ca, Mg, Sc, and combinations thereof. For example, the nanoparticles may comprise up to about 9 mol % of the at least one stabilizing agent, such as from about 1 mol % to about 8 mol %, from about 2 mol % to about 7 mol %, from about 3 mol % to about 6 mol %, or from about 4 mol % to about 5 mol % by weight of stabilizing agent. In certain embodiments, the nanoparticles may comprise yttria stabilized tetragonal zirconia nanoparticles, such as 3YSZ (3 mol % yttria stabilized zirconia).

In non-limiting embodiments, the at least one inorganic nanoparticle can have a refractive index $n_m$ ranging from about 1.6 to about 2.6, such as from about 1.6 to about 2.5, from about 1.7 to about 2.4, 1.8 to about 2.3, from about 1.9 to about 2.2, or from about 2 to about 2.1, including all ranges and subranges therebetween. According to various embodiments, the inorganic nanoparticles can have an average particle size along their longest dimension ranging, for example, from about 2 nm to about 250 nm, such as from about 5 nm to about 200 nm, from about 10 nm to about 100 nm, from about 20 nm to about 90 nm, from about 30 nm to about 80 nm, from about 40 nm to about 70 nm, or from about 50 nm to about 60 nm, including all ranges and subranges therebetween. According to various embodiments, the nanoparticles may become agglomerated, these agglomerates having an average size of up to about 1 micron, e.g., ranging from about 50 nm to about 900 nm, from about 100 nm to about 800 nm, from about 200 nm to about 700 nm, from about 300 nm to about 600 nm, or from about 400 nm to about 500 nm, including all ranges and subranges therebetween.

In certain embodiments, the particle size distribution (PSD) of the nanoparticles may be chosen to be on the order of the wavelength of light to be scattered, e.g., the PSD may range from about 5 nm to about 500 nm, such as from about 100 nm to about 450 nm, or from about 200 nm to about 400 nm, including all ranges and subranges therebetween. The nanoparticle PSD may thus be chosen to reduce the haze and/or halo effect of the waveguide layer and/or to improve the viewing angle of the OLED device, e.g., by selecting nanoparticles that are neither significantly larger nor significantly smaller than the wavelength of light to be scattered.

Figure 5:
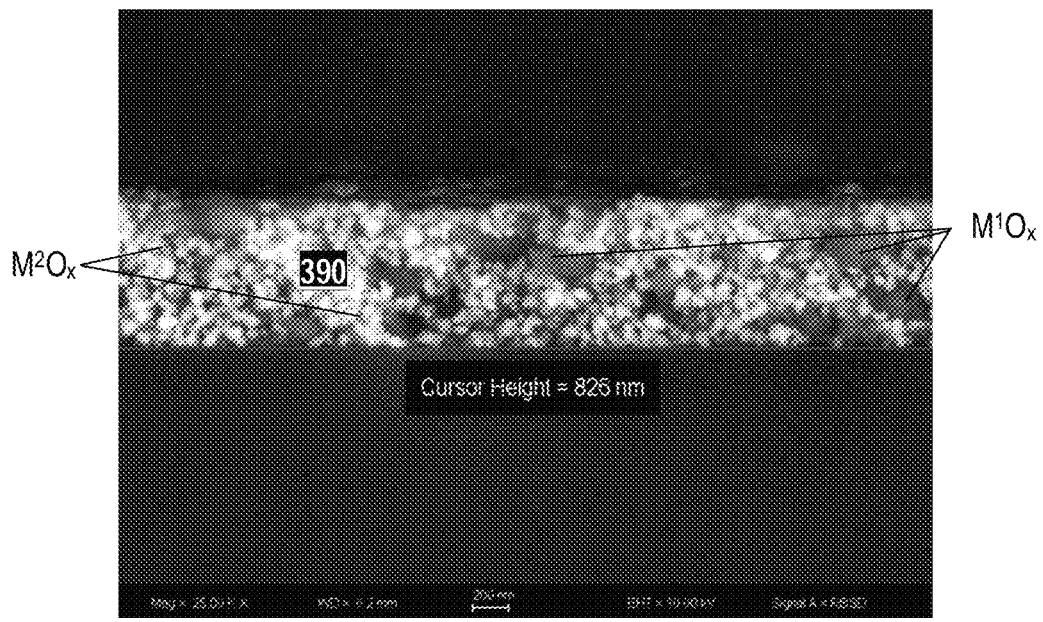
FIG. 5 is an SEM image of an OLED device configured as depicted in FIG. 4.

The waveguide layer 390, 490 may, in non-limiting embodiments, comprise a mixture of two or more inorganic nanoparticles, which may have the same or different average particle sizes and/or the same or different PSDs. For instance, as illustrated in FIG. 5, the waveguide layer 390 can comprise a plurality of first metal oxide nanoparticles $M^1O_x$ and a plurality of second metal oxide nanoparticles $M^2O_x$, which may have different average particle sizes and/or PSDs, where $M^1$ and $M^2$ are metals and x is a stoichiometric integer. The SEM image of FIG. 5 depicts a waveguide layer 390 comprising, by way of non-limiting example, a mixture of $Al_2O_3$ (200-500 nm) and $ZrO_2$ (5-50 nm) nanoparticles ($M^1$=Al; $M^2$=Zr). Of course, any other combination of metal oxides and/or particle sizes can be used.

The waveguide layer 390, 490 can further comprise at least one binder, e.g., hybrid organic-inorganic compounds such as silicate and organosilicon materials including, but not limited to, siloxanes and silsesquioxanes. The presence of the binder in the waveguide layer may in some embodiments, assist with the adhesion of the nanoparticles to the substrate and/or to each other. Non-limiting examples of suitable binders include, for instance, polymethylsilsesquioxanes, polyphenylsilsesquioxanes polymethylphenylsilsesquioxanes polymethylsiloxanes, polysilicatesilsesquioxanes, partially polymerized polymethylsiloxane (e.g. T-11, T-12, 512B spin on glass (Honeywell)), polydimethylsiloxane, polydiphenyl siloxane, partially polymerized polysilsesquioxane, polymethylsilsesquioxane (HardSil™ AM (Gelest)), and polyphenylsilsequioxane, polymethylphenyl silsesquioxane (HardSil™ AP (Gelest)). According to various embodiments, the binder compounds may include silicates or organosilicon compounds that are stable at temperatures above 450° C., have low organic burn off, and/or can be cured by a condensation reaction forming water as the by-product. In other embodiments, the at least one binder can have a refractive index $n_b$ ranging from about 1.3 to about 1.55, such as from about 1.35 to about 1.5, or from about 1.4 to about 1.45, including all ranges and subranges therebetween.

The at least one inorganic nanoparticle and binder may be present in the waveguide layer 390, 490 in amounts sufficient to produce the desired RMS surface roughness value, e.g., less than about 20 nm. In some embodiments, the inorganic nanoparticle may be present in the waveguide layer in concentrations of less than about 30% by weight of solids relative to the total weight of the waveguide layer, or less than 25%, or even less than 20%, such as ranging from about 5% to about 30%, from about 6% to about 25%, from about 7% to about 20%, from about 8% to about 19%, from about 9% to about 18%, from about 10% to about 17%, from about 11% to about 16%, from about 12% to about 15%, or from about 13% to about 14% by weight of solids. According to various embodiments, a ratio of nanoparticle solids concentration to binder solids concentration can range from about 1:1 to about 3:1, from about 1.2:1 to about 2.5:1, from about 1.5:1 to about 2.4:1, from about 1.6:1 to about 2.3:1, from about 1.7:1 to about 2.2:1, from about 1.8:1 to about 2.1:1, or from about 1.9:1 to about 2:1, including all ranges and subranges therebetween.

By using a mixture of high index nanoparticles and low index binder, it may be possible to change the volume fraction of the high index material to create a desired effective refractive index. In certain embodiments, the waveguide layer 390, 490 can have an effective refractive index $n_w$ of at least about 1.4, such as ranging from about 1.5 to about 1.8, or from about 1.6 to about 1.7, including all ranges and subranges therebetween. The effective refractive index of a composite material may be calculated, for example, by using Maxwell Garnett modeling. Alternatively, the effective refractive index of the waveguide layer may be calculated by the following formula:

$$n_w = \mathrm{sqrt}[(f(n_m^2)+(1-f)(n_b^2))]$$

where f is volume fraction based on SEM cross section and image analysis.

With reference to FIG. 6, the waveguide layer 490 can comprise a high density region 490A having an effective refractive index $n_{w1}$ and a low density region having an effective refractive index $n_{w2}$. In certain embodiments, the effective refractive index $n_{w1}$ of the high density region may be greater than the effective refractive index $n_{w2}$ of the low density region. For instance, $n_{w1}$ may be greater than or equal to about 1.7, whereas $n_{w2}$ may be less than about 1.7. In some embodiments, $n_{w1}$ may range from about 1.7 to about 2.6, such as from about 1.8 to about 2.5, from about 1.9 to about 2.4, from about 2 to about 2.3, or from about 2.1 to about 2.2, including all ranges and subranges therebetween. In additional embodiments, $n_{w2}$ may range from about 1.4 to about 1.65, such as from about 1.45 to about 1.6, or from about 1.5 to about 1.55, including all ranges and subranges therebetween.

The thickness of the waveguide layer 390, 490 can vary and, in some embodiments, can range from about 100 nm to about 2 μm. According to non-limiting exemplary embodiments, the thickness can range from about 200 nm to about 1.5 μm, from about 300 nm to about 1 μm, from about 400 nm to about 900 nm, from about 500 nm to about 800 nm, or from about 600 nm to about 700 nm, including all ranges and subranges therebetween. According to various embodiments, the waveguide layer can be optically transparent. As used herein, the term "optically transparent" refers to a layer or substrate having an optical transmission of at least about 75% at visible wavelengths (e.g., about 420-750 nm), such as at least about 80%, at least about 85%, at least about 90%, or at least about 95% optical transmission. An optically transparent waveguide layer may also, in some embodiments, have a haze of less than about 50%, such as less than about 45%, less than about 40%, less than about 35%, less than about 30%, less than about 25%, less than about 20%, less than about 15%, or less than about 10%, such as ranging from about 1% to about 50%, including all ranges and subranges therebetween.

Referring to FIG. 6, the waveguide layer 490 can comprise a high density region 490A having a first thickness $t_1$ and a low density region having a second thickness $t_2$. In certain embodiments, the first thickness $t_1$ of the high density region may be greater than the second thickness $t_2$ of the low density region. For instance, $t_1$ may be greater than or equal to about 200 nm, whereas $t_2$ may be less than about 200 nm. In some embodiments, $t_1$ may range from about 200 nm to about 2 μm, such as from about 300 nm to about 1 μm, from about 400 nm to about 900 nm, from about 500 nm to about 800 nm, or from about 600 nm to about 700 nm, including all ranges and subranges therebetween. In additional embodiments, $t_2$ may range from about 10 nm to about 190 nm, such as from about 25 nm to about 175 nm, from about 50 nm to about 150 nm, or from about 75 nm to about 100 nm, including all ranges and subranges therebetween. The second thickness $t_2$ may, in some embodiments, be less than 50 nm, such as less than about 40 nm, less than 30 nm, less than 20 nm, or less than 10 nm, including all ranges and subranges therebetween. According to further non-limiting embodiments, a volume fraction of the high density region 490A is at least about 30% relative to the total volume of the waveguide layer 490, such as ranging from about 30% to about 90%, from about 40% to about 80%, from about 50% to about 75%, or from about 60% to about 70%, including all ranges and subranges therebetween.

By using a mixture of nanoparticles and binder, it may also be possible to reduce the porosity of the waveguide layer and/or to remove any gases trapped therein and/or to reduce the formation of pinholes in the waveguide layer during subsequent processing steps. According to various embodiments, the waveguide layer 390, 490 can have a high density and/or low porosity. For instance, the overall density of the waveguide layer can be greater than about 1.8 g/cm$^3$, such as greater than about 2 g/cm$^3$, greater than about 2.5 g/cm$^3$, greater than about 3 g/cm$^3$, greater than about 3.5 g/cm$^3$, greater than about 4 g/cm$^3$, greater than about 4.5 g/cm$^3$, greater than about 5 g/cm$^3$, or greater than about 5.5 g/cm$^3$, or higher, e.g., ranging from about 1.8 to about 6 g/cm$^3$, including all ranges and subranges therebetween. The overall porosity of the waveguide layer may, in some embodiments, be less than about 10%, such as less than about 5%, less than about 4%, less than about 3%, less than about 2%, or less than about 1%, including all ranges and subranges therebetween. With reference to FIG. 6, the waveguide layer 490 may comprise a high density region 490A (e.g., density ranging from about 2.5-5.5 g/cm$^2$) and a low density region 490B (e.g., density ranging from about 1-3 g/cm$^3$).

According to non-limiting embodiments, the waveguide layer 390, 490 can have an RMS surface roughness of less than about 20 nm, such as less than about 15 nm, less than about 10 nm, or less than about 5 nm (e.g., 20, 19, 18, 17, 16, 15, 14, 13, 12, 11, 10, 9, 8, 7, 6, 5, 4, 3, 2, or 1 nm), including all ranges and subranges therebetween. In various embodiments, the RMS surface roughness may be greater than 20 nm, e.g., greater than 30 nm, greater than 40 nm, or even up to 50 nm, in which embodiments an optional planarizer layer may be included. RMS roughness is described in ASME B46.1 as the root mean square average of the profile height deviations from the mean line, recorded within the evaluation length. In some embodiments, surface roughness may be measured by atomic force microscopy (AFM). According to additional embodiments, RMS surface roughness of the waveguide layer may refer to the roughness of a light scattering surface (e.g., surface 395, 495) of the waveguide. For instance, the light scattering surface adjacent the OLED components (e.g., cathode or anode) may have an RMS surface roughness of less than about 20 nm.

As used herein, the terms "light scattering surface," "scattering surface," and "scattering layer" are used interchangeably to refer to a region capable of scattering incident light. The "surfaces" need not be exterior surfaces of the OLED device, but can also refer to interior scattering regions within the stack of layers (e.g., the interfaces between layers). Light extraction in the waveguide layer can occur by way of surface scattering (exterior and/or interior scattering surfaces) and/or volumetric scattering mechanisms (voids in the layers), which can allow the waveguide layer to efficiently extract light from within the OLED device to the environment.

Without wishing to be bound by theory, it is believed that the low surface roughness of the waveguide layer may prevent significant mode coupling of the transverse electric (TE) and transverse magnetic (TM) modes within the OLED layers to the highly attenuated surface plasmon mode. However, the surface morphology may contain lateral surface frequencies high enough to cause mode coupling among the TE and TM modes, which can promote coupling from the lower, more tightly bound guided modes to the higher modes which are more easily extractable. As such, the surrogate light extraction efficiency (EE) value of the waveguide layer 390, 490 may be greater than about 2, or even as high as about 3, such as ranging from about 2 to about 2.9, from about 2.1 to about 2.8, from about 2.2 to about 2.7, from about 2.3 to about 2.6, or from about 2.4 to about 2.5, including all ranges and subranges therebetween. Waveguide layers having a low surface roughness may also prevent electrical degradation of the OLED device and/or prevent light absorption by the metal cathode due to metal roughness in the OLED device.

According to various embodiments, the OLED devices disclosed herein may comprise a substrate having a single waveguide layer. As used herein, a "single" layer is intended to refer to a waveguide in which the nanoparticles and binder are interspersed in one layer, rather than layered as two separate films (compare, e.g., FIG. 3 having a separate light scattering layer and planarizer layer). In certain embodiments, the waveguide layer 390, 490 may have a sufficiently low RMS surface roughness such that a planarizer layer is not necessary to smooth the surface of the waveguide layer. OLED devices disclosed herein may thus be free of planarizer layers or may comprise light extracting structures that do not include planarizer layers. For instance, the substrate comprising the at least one waveguide layer may not comprise a planarizer film. However, in certain embodiments, one or more planarizer layers may be present, and these layers can, for example, have a thickness of less than or equal to about 200 nm, such as less than about 150 nm, less than about 100 nm, less than about 50 nm, less than about 40 nm, less than about 30 nm, less than about 20 nm, or less than about 10 nm, e.g., ranging from about 10 nm to about 200 nm, including all ranges and subranges therebetween.

Exemplary substrates 380, 480 can include any substrate suitable for use in OLED and display devices, such as glass and plastic substrates. Non-limiting examples of suitable substrates may include, but are not limited to, polymethyl methacrylate (PMMA) and glasses such as fused silica, quartz, aluminosilicate, alkali-aluminosilicate, borosilicate, alkali-borosilicate, aluminoborosilicate, or alkali-aluminoborosilicate glasses. Non-limiting examples of commercially available glasses suitable for use include, for instance, EAGLE XG®, Iris™, Lotus™, Willow®, and Gorilla® glasses from Corning Incorporated.

In certain embodiments, the substrate may have a thickness of less than or equal to about 3 mm, for example, ranging from about 0.1 mm to about 2.5 mm, from about 0.3 mm to about 2 mm, from about 0.7 mm to about 1.5 mm, or from about 1 mm to about 1.2 mm, including all ranges and subranges therebetween. According to additional embodiments, the substrate may have a refractive index $n_s$ ranging from about 1.3 to about 1.8, such as from about 1.35 to about 1.7, from about 1.4 to about 1.65, from about 1.45 to about 1.6, or from about 1.5 to about 1.55, including all ranges and subranges therebetween. In further embodiments, the substrate may be optically transparent.

Methods

Disclosed herein are methods for making a waveguide, the methods comprising combining a first dispersion and a second dispersion to form a combined dispersion, wherein the first dispersion comprises at least one first solvent and at least one inorganic nanoparticle having a refractive index $n_m$ ranging from about 1.6 to about 2.6, the second dispersion comprises at least one second solvent and at least one binder having a refractive index $n_b$ ranging from about 1.3 to about 1.55; and coating the combined dispersion on at least one surface of a substrate to form a waveguide layer having an RMS surface roughness of less than about 20 nm.

According to various embodiments, the first dispersion can comprise from about 10% to about 75% by weight of inorganic nanoparticles (solids content), such as from about 15% to about 70%, from about 20% to about 65%, from about 25% to about 60%, from about 30% to about 55%, from about 35% to about 50%, or from about 40% to about 45% by weight of inorganic nanoparticles, including all ranges and subranges therebetween. In certain embodiments, the viscosity of the first dispersion can range from about 20 cP to about 500 cP, such as from about 50 cP to about 400 cP, from about 100 cP to about 300 cP, or from about 200 cP to about 250 cP, including all ranges and subranges therebetween.

The second dispersion can comprise from about 10% to about 30% by weight of binders (solids content), such as from about 12% to about 25%, or from about 15% to about 20% by weight of binders, including all ranges and subranges therebetween. In certain embodiments, the viscosity of the second dispersion can range from about 1 cP to about 500 cP, such as from about 5 cP to about 400 cP, from about 10 cP to about 300 cP, from about 20 cP to about 200 cP, or from about 50 cP to about 100 cP, including all ranges and subranges therebetween. According to some non-limiting embodiments, the second dispersion may have a viscosity of less than 20 cP, such as ranging from about 5 cP to about 10 cP.

Suitable solvents may include, for example, water, alcohols, polar and nonpolar organic solvents, and combinations thereof. The first and/or second dispersion may further comprise one or more additives chosen from binders, dispersants, surfactants, and the like. Binders may be used, for instance, to hold the nanoparticles together during the coating process and any subsequent drying or curing process. Non-limiting examples of binders include, for example, poly vinyl alcohol, acrylics, poly vinyl butyral, poly ethylene oxide and polyethylene glycols of various molecular weights, polyvinyl pyrrolidone, cellulosics such as hydroxymethylcellulose, hydroxyethylcellulose and hydroxyproplycellulose, gums such as agar gum and gum Arabic, acrylics, vinylacrylics, acrylic acids, polyacrylamides, starches, and combinations thereof. Dispersants or surfactants can be used to coat the nanoparticles and/or to minimize agglomeration. Suitable dispersants or surfactants can include, for example, Emphos PS-21A and flocculating agents such as glacial acetic acid.

Coating methods to produce the waveguide layer include methods known in the art for producing a thin coating having a surface with the desired properties. Nanoparticle, binder, and solvent concentrations may be varied to provide the desired concentration in the end product. Exemplary methods include, but are not limited to, dip coating, slot coating spin coating, screen printing, ink jet coating, spraying, vapor or particle deposition, roller coating or roll-to-roll processing, etc. Other techniques for forming a thin layer on a substrate surface are also envisioned as falling within the scope of the disclosure.

After coating the combined dispersion on a surface of the substrate, the combined dispersion can be subjected to a thermal treatment step, for example, to burn off any organic materials (e.g., solvents, binders, dispersants, etc.), and/or cure or crosslink the binder. For instance, the waveguide layer may be heated to a first temperature greater than about 125° C., such as greater than about 150° C., greater than about 200° C., greater than about 250° C., greater than about 300° C., greater than about 350° C., greater than about 400° C., greater than about 420° C., or greater than about 450° C., including all ranges and subranges therebetween. Thermal treatment times can vary depending on the application and/or desired properties of the waveguide and can range, for example, from about 10 minutes to about 3 hours, such as from about 30 minutes to about 2 hours, or from about 60 minutes to about 90 minutes, including all ranges and subranges therebetween. Multi-step thermal treatments can also be used, for instance, holding at a first treatment temperature for a first time period and at a second treatment temperature for a second time period, the treatment temperatures and time periods being chosen from those listed above.

According to various embodiments, an optional planarizer layer can be applied to one or more of the surfaces of the waveguides disclosed herein, e.g., to the first and/or second surfaces of the single-layer waveguide or to the outer surface of the multi-layer waveguide. The planarizer layer can be applied using any method known in the art, for example, slot coating, dip coating, vacuum deposition, and other similar processes. In some embodiments, the planarizer layer can have a thickness of less than about 100 nm, such as less than about 50 nm, less than about 40 nm, less than about 30 nm, less than about 20 nm, or less than about 10 nm, including all ranges and subranges therebetween.

It will be appreciated that the various disclosed embodiments may involve particular features, elements or steps that are described in connection with that particular embodiment. It will also be appreciated that a particular feature, element or step, although described in relation to one particular embodiment, may be interchanged or combined with alternate embodiments in various non-illustrated combinations or permutations.

It is also to be understood that, as used herein the terms "the," "a," or "an," mean "at least one," and should not be limited to "only one" unless explicitly indicated to the contrary. Thus, for example, reference to "a layer" includes examples having two or more such layers unless the context clearly indicates otherwise. Likewise, a "plurality" is intended to denote "more than one." As such, a "plurality of layers" includes two or more such layers, such as three or more such layers, etc.

Ranges can be expressed herein as from "about" one particular value, and/or to "about" another particular value. When such a range is expressed, examples include from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

The terms "substantial," "substantially," and variations thereof as used herein are intended to note that a described feature is equal or approximately equal to a value or description. For example, a "substantially planar" surface is intended to denote a surface that is planar or approximately planar. Moreover, as defined above, "substantially similar" is intended to denote that two values are equal or approximately equal. In some embodiments, "substantially similar" may denote values within about 10% of each other, such as within about 5% of each other, or within about 2% of each other.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a device that comprises A+B+C include embodiments where a device consists of A+B+C and embodiments where a device consists essentially of A+B+C.

It will be apparent to those skilled in the art that various modifications and variations can be made to the present disclosure without departing from the spirit and scope of the disclosure. Since modifications combinations, sub-combinations and variations of the disclosed embodiments incorporating the spirit and substance of the disclosure may occur to persons skilled in the art, the disclosure should be construed to include everything within the scope of the appended claims and their equivalents.

The following Examples are intended to be non-restrictive and illustrative only, with the scope of the invention being defined by the claims.

EXAMPLES

Example 1

Figure 8:
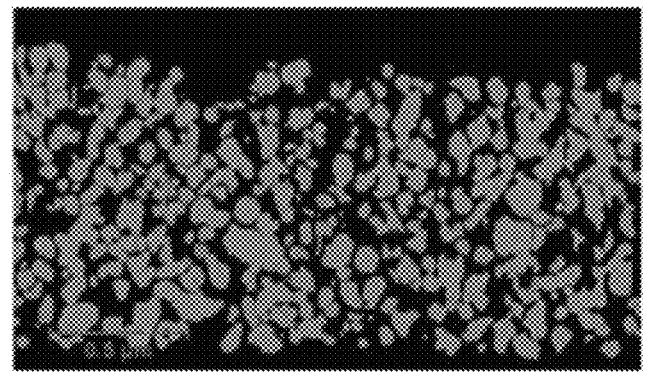
FIG. 8 is an SEM image of an exemplary waveguide layer.

Waveguide layers were prepared on glass substrates by slot coating various combined dispersions of zirconia and polysiloxane 512B (Honeywell, ~10-15 wt % polymer solids) to produce a waveguide layer having a wet thickness of 10-20 microns. The waveguide layer was subsequently dried at 420° C. Zirconia concentrations in the waveguide layer ranged from 10 wt % to 35 wt %. Cross-sectional SEM analysis was conducted on the waveguide samples. The total area fraction of zirconia nanoparticles for the sample depicted in FIG. 8 was 48%. The area fraction of nanoparticles in the bottom half of the sample was 50%, whereas the area fraction in the top half was 46%. The area fraction of nanoparticles in the top 200 nm of the sample was 42%. A 3D volume analysis confirmed that the area fraction value corresponded well to the volumetric fraction value.

Figure 9:
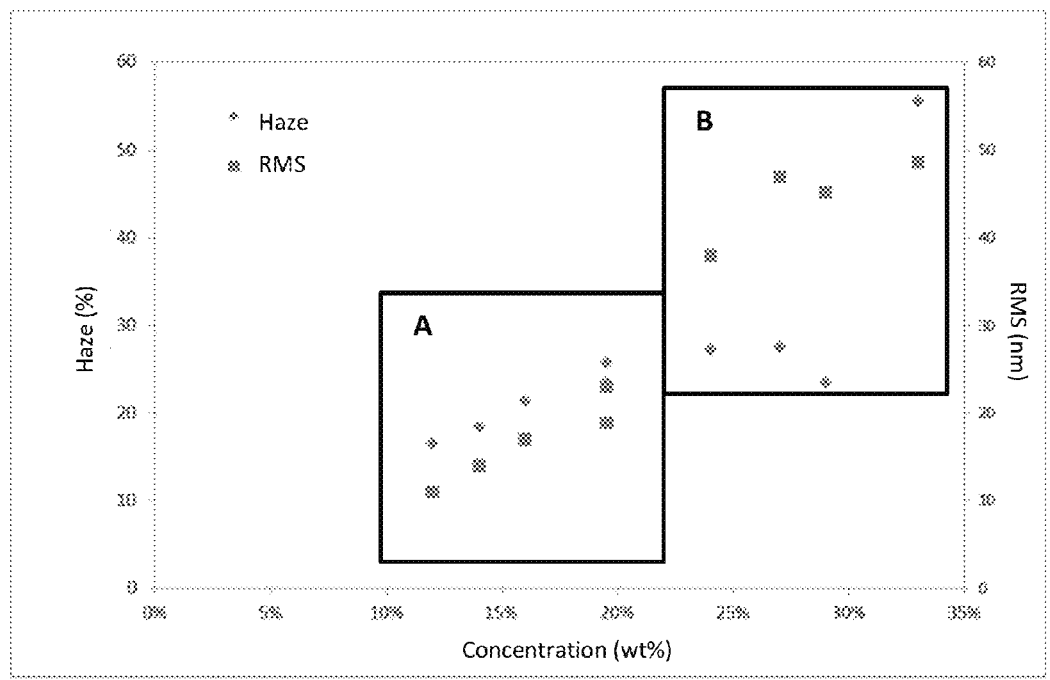
FIG. 9 is a graphical illustration of haze and RMS surface roughness plotted as a function of nanoparticle concentration in a waveguide layer.

Haze and RMS roughness of the waveguide layers are plotted as a function of nanoparticle concentration in FIG. 9. As can be appreciated from the plot, most of the tested samples exhibited haze values below 30% (with the exception of the sample comprising 34 wt % zirconia), indicating that the waveguide layers have acceptable optical properties. However, the samples within box A exhibited RMS surface roughness values of about 20 nm or less, whereas the samples within box B exhibited much higher RMS values. Box A represents those samples having a weight ratio of nanoparticle:binder of less than 2.5:1, whereas box B represents samples having a ratio greater than 2.5:1. In order to prevent electrical degradation of the OLED device, the waveguide layers falling within box B should be coated with an additional planarizer layer to reduce the RMS value to below 20 nm. In contrast, the waveguide layers falling within box A may be used without such a planarizer layer.

Example 2

Figure 10:
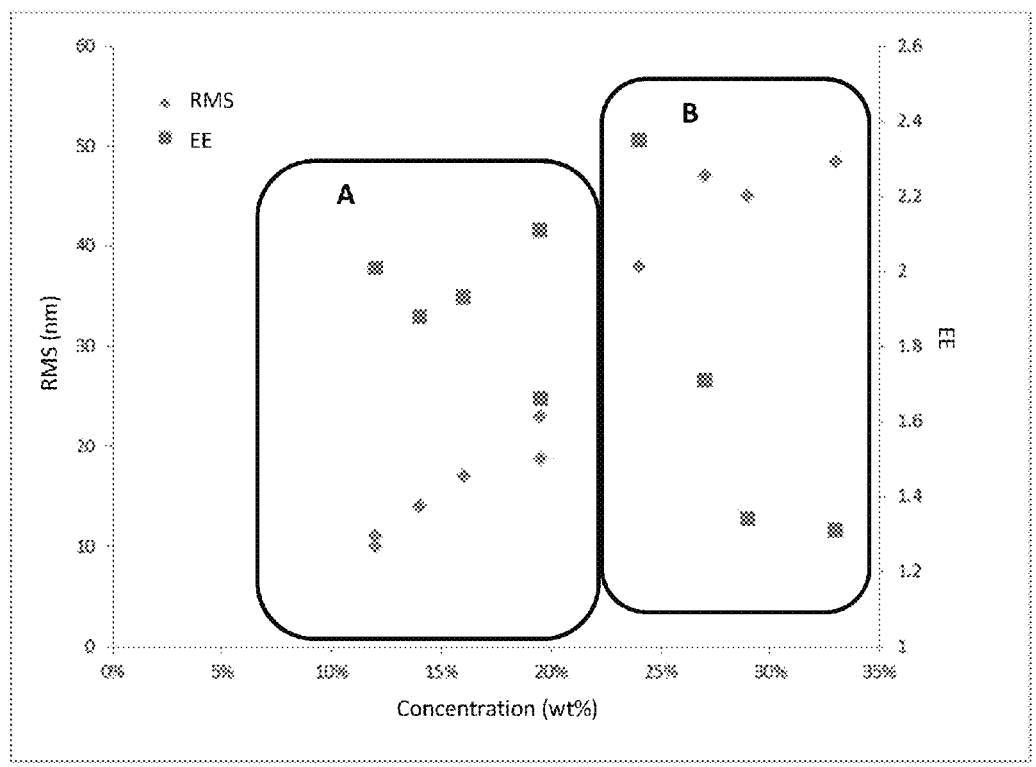
FIG. 10 is a graphical depiction of optical surrogate EE and RMS surface roughness plotted as a function of nanoparticle concentration in a waveguide layer.

The waveguide layers of Example 1 were further processed by evaporating OLED active materials (AlQ3) and cathode (Ag) materials onto the waveguide layers. The resulting stacks were measured for light extraction efficiency using a fluorescence microscope. Optical surrogate extraction efficiency (EE) and RMS roughness of the waveguides are plotted as a function of nanoparticle concentration in FIG. 10. Once again, box A represents those samples having a weight ratio of nanoparticle:binder of less than 2.5:1, whereas box B represents samples having a ratio greater than 2.5:1. Samples falling within box A exhibit RMS values of about 20 nm or less and surrogate EE values on the order of 1.6-2.1. Samples falling within box B exhibit surrogate EE values on the order of 2-2.3, but also have higher RMS values (~35-50 nm), indicating that the OLED devices will fail electrically unless an additional planarization layer is included to smooth the waveguide layer. In contrast, waveguide layers having an RMS surface roughness of less than 20 nm can be used without the addition of a planarizer film and can exhibit comparatively high surrogate EE values.

What is claimed is:

1. An organic light emitting diode device comprising:
a cathode;
an anode;
an organic light emitting layer disposed between the cathode and anode; and
a substrate comprising at least one waveguide layer comprising at least one inorganic nanoparticle and at least one binder interspersed in the at least one waveguide layer, wherein:
the at least one inorganic nanoparticle has a refractive index $n_m$ ranging from about 1.6 to about 2.6,
the at least one binder has a refractive index $n_b$ ranging from about 1.3 to about 1.55,
an RMS surface roughness of the at least one waveguide layer is less than about 20 nm, and
the at least one inorganic nanoparticle comprises a combination of a first metal oxide nanoparticle and a second metal oxide nanoparticle, the first and second metal oxide nanoparticles having different particle size distributions.

2. The device of claim 1, wherein the waveguide layer comprises a high density region having an effective refractive index $n_{w1}$ greater than or equal to about 1.7 and a low density region having an effective refractive index $n_{w2}$ ranging from about 1.4 to less than about 1.7, wherein the at least one inorganic nanoparticle and the at least one binder are both distributed in the high density region and in the low density region.

3. The device of claim 2, wherein the high density region has a thickness ranging from about 200 nm to about 2 μm and the low density region has a thickness of less than about 200 nm.

4. The device of claim 2, wherein the high density region comprises from about 30% to about 90% by volume of the at least one waveguide layer.

5. The device of claim 1, wherein the at least one waveguide layer has a haze of less than about 50% and an optical transmission of greater than about 75% at visible wavelengths ranging from about 420 nm to about 750 nm.

* * * * *